US008767898B2

(12) United States Patent
Verhaegen et al.

(10) Patent No.: US 8,767,898 B2
(45) Date of Patent: Jul. 1, 2014

(54) METHOD AND SYSTEM OF SYNCHRONIZING DATA TO REFERENCE TIME SIGNAL WITH DATA RESAMPLING

(75) Inventors: Gery Verhaegen, Vlaams Brabant (BE); Tom Vandeplas, Rotselaar (BE)

(73) Assignee: Agilent Technologies, Inc., Santa Clara, CA (US)

( * ) Notice: Subject to any disclaimer, the term of this patent is extended or adjusted under 35 U.S.C. 154(b) by 883 days.

(21) Appl. No.: 12/910,263

(22) Filed: Oct. 22, 2010

(65) Prior Publication Data

US 2012/0099687 A1 Apr. 26, 2012

(51) Int. Cl.
*H04L 7/00* (2006.01)
(52) U.S. Cl.
USPC .......................................................... 375/355
(58) Field of Classification Search
USPC ............ 375/340, 354, 355, 362, 371; 327/14, 327/45, 551, 552
See application file for complete search history.

(56) References Cited

U.S. PATENT DOCUMENTS

| | | | |
|---|---|---|---|
| 5,748,120 A * | 5/1998 | Yasuda | 341/61 |
| 5,952,876 A * | 9/1999 | Sakoda et al. | 327/551 |
| 2004/0093177 A1* | 5/2004 | Schweitzer et al. | 702/64 |
| 2009/0210070 A1* | 8/2009 | Schultz et al. | 700/7 |

OTHER PUBLICATIONS

C.W. Farrow, "A continuously variable digital delay element", Circuits and Systems, 1988., Symposium on IEEE International, Publication Year: 1988, vol. 3, pp. 2641-2645.
T.I. Laakso et al., "Splitting the unit delay", , IEEE Signal Processing Magazine, vol. 13 , Issue: 1, Publication Year: Jan. 1996, pp. 30-60.

* cited by examiner

*Primary Examiner* — Sam K Ahn
*Assistant Examiner* — Syed Haider

(57) ABSTRACT

A device receives a data signal and a reference timing signal provided from a first clock. The device includes a sample clock that operates independently from the first clock, wherein the sample clock outputs a sample clock signal that is asynchronous with the reference timing signal; a sampler for sampling a data signal in accordance with the sample clock signal and outputting a sampled data signal; and a resampler for resampling the sampled data signal according to a resampling ratio and outputting a resampled data signal such that a number of data samples in the resampled data signal within a synchronization time interval defined with respect to the reference timing signal equals a nominal number of data samples that would occur in the sampled data signal within the synchronization time interval when the sample clock signal was synchronized to the reference timing signal.

19 Claims, 5 Drawing Sheets

METHOD AND SYSTEM OF SYNCHRONIZING DATA TO REFERENCE TIME SIGNAL WITH DATA RESAMPLING

BACKGROUND

In many applications where two or more apparatuses may share or communicate data with each other. In some applications, it is desirable to be able to very accurately synchronize the data to a common sense of time that is shared among the apparatuses. Synchronization becomes a necessity, for example, when apparatuses working at a significant distance from each other must also work in conjunction with each other.

As an example, FIG. 1 illustrates an example of a test system 10 comprising a plurality of test instruments 2 in communication with each other over a communication channel 4. In some embodiments, communication channel 4 may operate in accordance with a set of standard protocols, for example Ethernet or LAN eXtensions for Instrumentation (LXI). In some embodiments, communication channel 4 may include the Internet. One or more of test instruments 2 may be configured to receive and/or transmit data from, or to, one or more devices 6, for example devices under test (DUTs).

In the example test system 10, test instruments 2 work in conjunction with each other to test and/or measure data or parameters of one or more devices 6 which, in some cases may belong to a larger system or network. Furthermore, test instruments 2 may be separated from each other by significant distances, such that in some embodiments no common reference clock is distributed to the test instruments 2 via communication channel 4.

Accordingly, it may be necessary to synchronize data that is gathered, processed and/or processed by the test instruments 2 such that the test instruments 2 can work in conjunction to process the data appropriately. A test instrument 2 may include an internal clock which sets a timing by which data is sampled and processed within the test instrument. 2. To synchronize data operations among a plurality of test instruments 2 in a test system 10, the clocks of all of the test instruments 2 may be set to the same frequency, or to have a known frequency relationship with respect to each other.

However, even if two clocks are designed identically and set to operate at the same frequency, there is no guarantee that they will stay in synchronization. Several factors can cause two identical clocks to drift in frequency with respect to each other. Factors such as differences in manufacturing tolerances, differences in operating temperature or voltage, and the age of the clocks themselves can all affect the quality of synchronization. As a result, the clocks may drift with respect to each other such that when viewed over a long enough period of time they are not operating at the same frequency. As a result, over a long enough period of time, data sampled and processed by test instruments 2 will not remain synchronized.

Accordingly, it would be desirable to provide a method and system for synchronizing data that may be shared among two or more apparatuses that each operate with their own clock. It would also be desirable to provide a method and system for synchronizing data sampled with an internal clock, to an externally supplied reference timing signal, and particularly an externally supplied timing signal that provides absolute time information.

SUMMARY

In an example embodiment, a device comprises: an input for providing a reference timing signal generated from a first clock; a sample clock that operates independently from the first clock, wherein the sample clock outputs a sample clock signal that is asynchronous with the reference timing signal; a sampler for sampling a data signal in accordance with the sample clock signal and outputting a sampled data signal; and a resampler for resampling the sampled data signal according to a resampling ratio and outputting a resampled data signal such that a number of data samples in the resampled data signal within a synchronization time interval defined with respect to the reference timing signal equals a nominal number of data samples that would occur in the sampled data signal within the synchronization time interval if the sample clock signal was synchronized to the reference timing signal.

In another example embodiment, a method comprises providing a reference timing signal; generating a sample clock signal independent of and asynchronous with the reference timing signal; receiving a data signal; sampling the data signal in response to the sample clock signal to produce a sampled data signal; setting a resampling ratio; and resampling the sampled data signal according to the resampling ratio. The resampling ratio is updated once for each synchronization time interval such that a number of data samples in the resampled data signal within each synchronization time interval equals a nominal number of data samples that would occur in the sampled data signal within the synchronization time interval if the sample clock signal was synchronized to the reference timing signal. The synchronization time interval is defined with respect to the reference timing signal.

In yet another example embodiment, a method: provides a reference timing signal according to a first clock; outputs a sample clock signal that is asynchronous with the reference timing signal according to a sample clock that operates independently from the first clock; sampling a data signal according to the sample clock signal and outputting a sampled data signal; resampling the sampled data signal according to a resampling ratio; and outputting a resampled data signal such that a number of data samples within a synchronization time interval defined with respect to the reference timing signal equals a nominal number of data samples having an equivalent number of sample that would occur in the sampled data signal within the synchronization time interval when the sample clock signal was synchronized to the reference timing signal.

BRIEF DESCRIPTION OF THE DRAWINGS

The example embodiments are best understood from the following detailed description when read with the accompanying drawing figures. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

As noted above, two or more apparatuses which are located at some distance with respect to each other may share or communicate data with each other in systems or situations where it is desirable or necessary to be able to very accurately synchronize the data to a common sense of time that is shared among the apparatuses. In some situations, it may not be possible to distribute a common clock frequency to these apparatuses. To synchronize data operations among such apparatuses, the data may be stamped with a time stamps reflecting a common sense of time shared among the apparatuses, such as an absolute time. For example, an apparatus may time stamp data with a coordinated universal time (UTC) time stamp.

Figure 1:
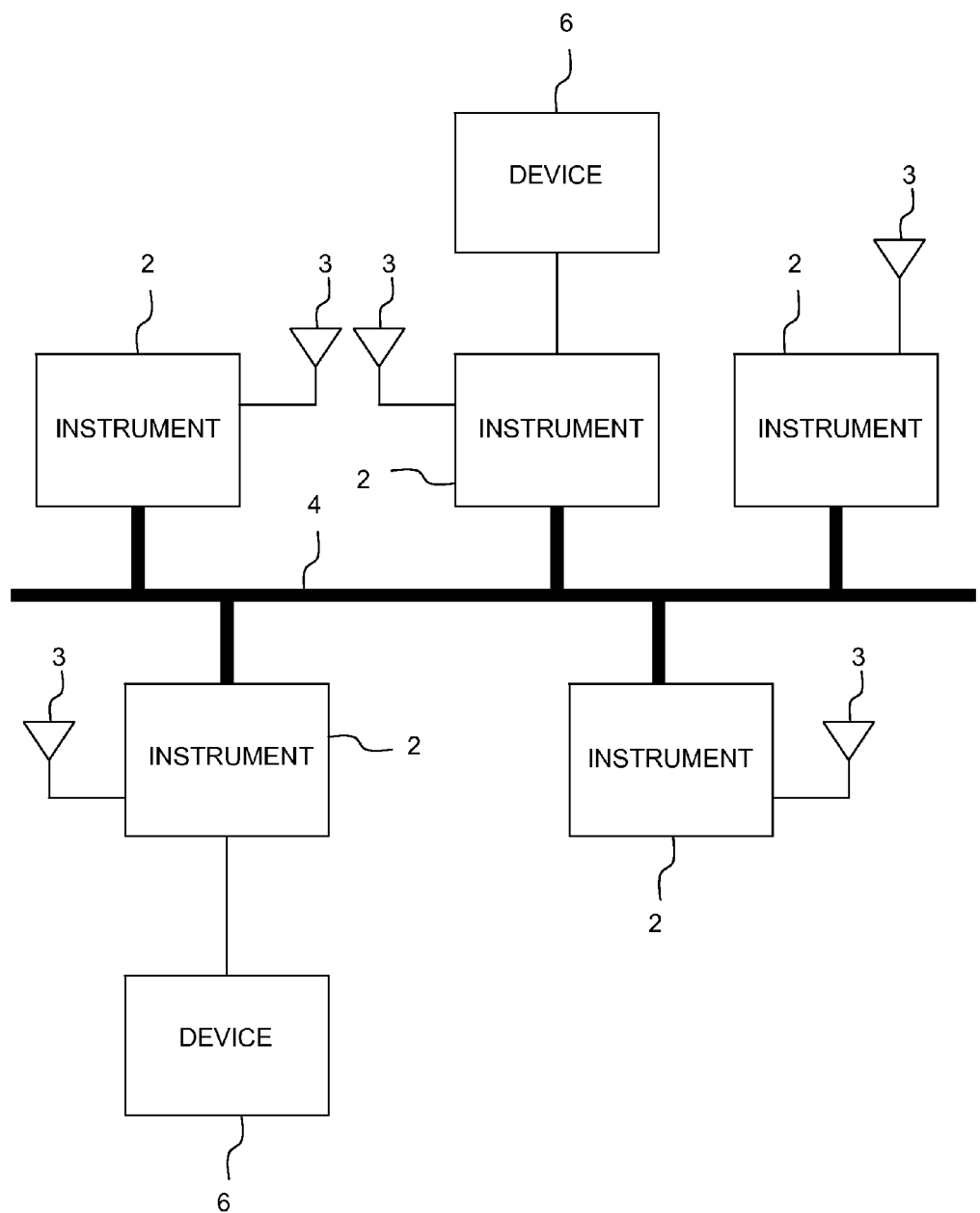
FIG. 1 illustrates an example of a test system.

As noted above, FIG. 1 illustrates an example of a test system 10 where the test instruments 2 operate in conjunction with each other to measure or test data. Test instruments 2 may obtain a common sense of time from a reference timing signal employed by test system 10. In some embodiments, test instruments 2 may include a Global Position System (GPS) receiver 3 that receives as a reference timing signal a GPS timing signal, for example a GPS pulse per second (PPS) signal, and generates UTC time stamps from the GPS timing signal. In other embodiments, test instruments 2 may receive a reference timing signal (e.g., a timing signal synchronized to UTC) via an IEEE-1588 interface, for example over communication channel 4. Other arrangements are possible for distributing a reference timing signal to test instruments 2 for sharing a common sense of time.

To synchronize data within test system 10, test instruments 2 may time stamp data with a time stamp, for example a UTC time stamp, produced by test instrument 2 from a reference timing signal, as described above.

However, time stamping every data sample processed by test instruments 2 results in a very large overhead and is not desirable or practical in many systems.

Therefore, instead of time stamping every data sample, in some embodiments a test instrument 2 in test system 10 may keep track of data timing within a sampled data signal by periodically time stamping data samples in the sampled data signal. For example, a test instrument 2 may insert a time stamp for one data sample every 1000 seconds in a sampled data signal.

However, in such an arrangement, a problem may arise when the sample clock used to sample the data is not synchronized to the reference timing signal used to generate the time stamps. The problem will be explained with respect to FIG. 2.

Figure 2:
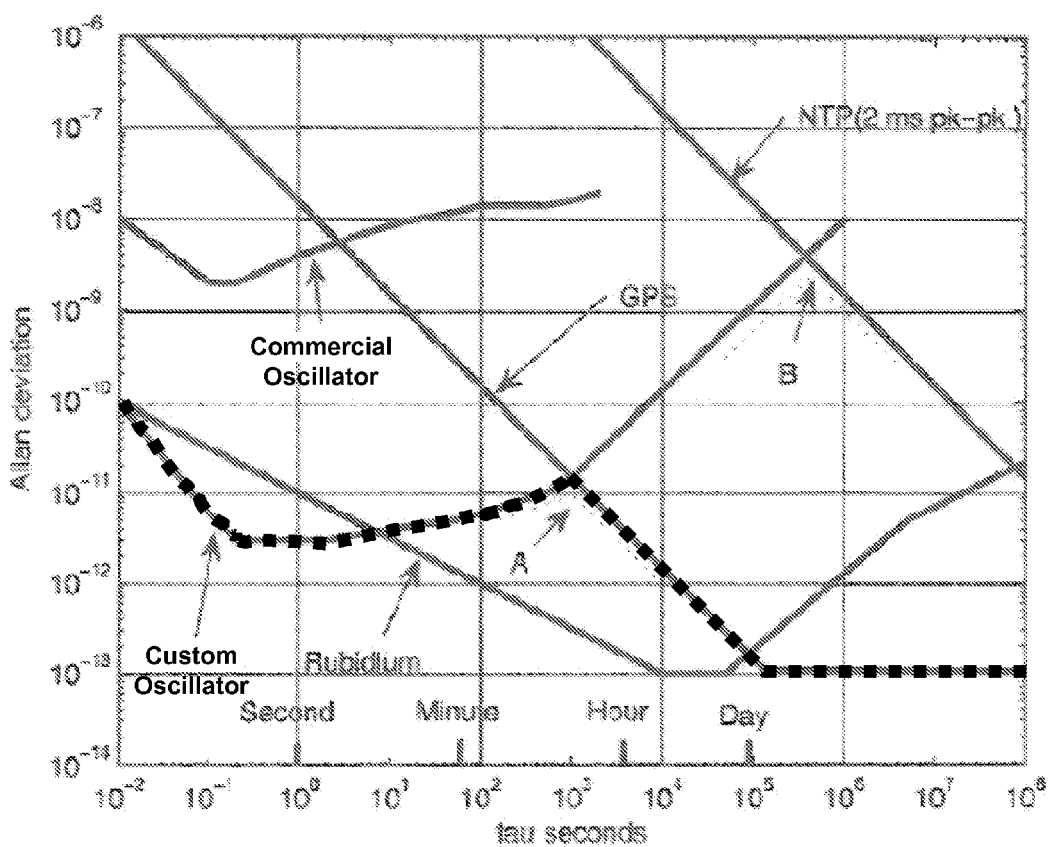
FIG. 2 shows a graph illustrating example Allen variance characteristics of various clock or time sources.

FIG. 2 shows a graph illustrating example Allen variance characteristics of various clock or time sources, including: a rubidium clock; an example commercial oscillator; an example low-noise custom oscillator; a timing signal according to the Network Timing Protocol for PC over the Internet (NTP (2 ms pk-pk)); and a GPS timing signal. In general, it is not practical to furnish each test instrument 2 with a rubidium clock, However, as shown in FIG. 2, a custom oscillator' clock signal may exhibit relatively little Allen variance over relatively small time intervals, Tau, of less than 1000 seconds for example. However over longer time intervals, the Allen variance of a custom oscillator's clock signal increases, reflecting long term frequency drift. Meanwhile, a GPS timing signal exhibits a relatively low Allen variance over relatively large time intervals of greater than 1000 seconds for example, and consequently is well suited to being a reference time signal for time stamping data in a test instrument 2.

If a data signal is sampled with a custom oscillator's clock signal having a relatively high long term frequency drift as shown in FIG. 2, and then periodic data samples are time stamped with a time stamp generated from a reference timing signal such as a GPS timing signal, for example, there will be an indeterminate error between the data samples and the time stamps over a long period of time because of the frequency drift between the custom oscillator and the reference timing signal. For example, consider a case where a data signal is sampled at 1000 samples/second according to a sample clock comprising a custom oscillator, and where one time stamp is inserted in the sampled data signal every 1000 seconds as measured with respect to the timing of a GPS timing signal. In that case, ideally there would always be one million data samples between adjacent time stamps. However because of frequency drift between the sample clock (custom oscillator) and the GPS timing signal, in actuality in some cases there will be only 999,999 data samples between adjacent time stamps, in other cases there will be 1 million+one data samples between adjacent time stamps, in still other cases there will be 1 million data samples between adjacent time stamps, etc.

One possible solution to this problem is to synchronize the sample clock (custom oscillator) with the reference timing signal (e.g., a GPS PPS signal) used to generate the time stamps.

In a conceptually simple approach, the sample clock could be provided as a frequency tunable oscillator, for example a voltage control oscillator (VCO) that is locked via a phase locked loop (PLL) to the reference timing signal (e.g., a GPS PPS signal) used to generate the time stamps. In that case, when the reference timing signal is a GPS timing signal, because of the poor short term stability of the GPS timing signal as shown in FIG. 2, it is desired the PLL feedback loop should have a time constant on the order of 1000 seconds to maintain the good short term stability (i.e., phase noise) of the custom oscillator while obtaining the long term drift characteristics of the GPS signal (see the dashed curve in FIG. 2). However, analog low pass PLL filters having such large time constants are difficult to implement, making such an arrangement undesirable.

Figure 3:
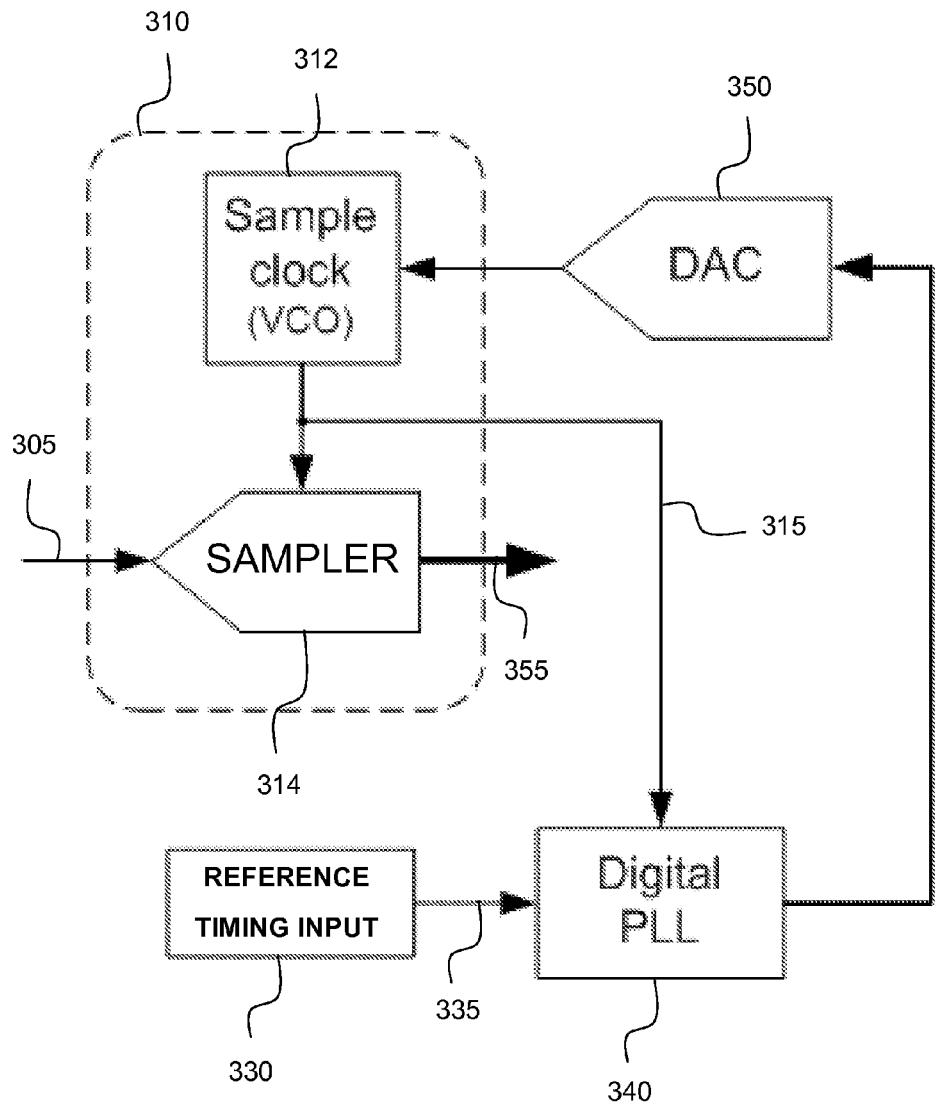
FIG. 3 shows portions of a device including an arrangement for synchronizing a sample clock to a common sense of time.

FIG. 3 illustrates portions of a device 300 including another arrangement for synchronizing a sample clock to a reference timing signal providing a common sense of time to a plurality of apparatuses in a system. As shown in FIG. 3, device 300 includes a signal processor 310, a reference timing input 330, a digital phase lock loop (PLL) 340, and a digital-to-analog converter (DAC) 350. Signal processor 310 includes a sample clock 312 and a sampler 314. Sample clock 312 comprises a frequency tunable oscillator, for example a voltage control oscillator (VCO). In some embodiments, sampler 314 may comprise an analog-to-digital converter (ADC). In some embodiments, reference timing input 330 may comprise a GPS receiver that receives a GPS signal and provides a GPS PPS signal that may be synchronized to UTC. In other embodiments, reference timing input 330 may comprise an IEEE-1588 interface that provides a signal synchronized to UTC. Other arrangements are possible.

In operation, sample clock 312 outputs a sample clock signal 315. Sampler 314 samples a data signal 305 in accordance with sample clock signal 315, and outputs a sampled data signal 355. Meanwhile, reference timing input 330 provides to digital PLL 340 a reference timing signal 335 generated from a first clock that is external to device 300, for example a clock associated with a GPS transmitter or a system clock included in another device connected over a network to device 300. Digital PLL 340 and DAC 350 synchronize sample clock 312 (e.g., a VCO) to reference timing signal 335.

Accordingly, since sample clock 312 is synchronized to reference timing signal 335, if time stamps are then periodically inserted in sampled data signal 355 at a fixed interval as measured with respect to reference timing signal 335, there will be an equal number of data samples between each time stamp.

However, in many situations the arrangement shown in FIG. 3 is undesirable or impractical for various reasons. For example, it may not be desirable to employ a tunable oscillator for the reference clock as a VCO will often have increased phase noise compared for example to a low noise crystal oscillator. Furthermore, in some devices, such as certain test instruments 2 in a test system 10, great care is taken to segregate the analog portion or domain of the device from the analog portion or domain of the device, particularly to keep noise and/or switching transients in the digital domain from adding noise and/or spurious frequencies onto critical low noise signals in the analog domain. In such devices it is therefore undesirable to provide the arrangement shown in FIG. 3 which couples digital signals into the analog portion of device 300.

Figure 4:
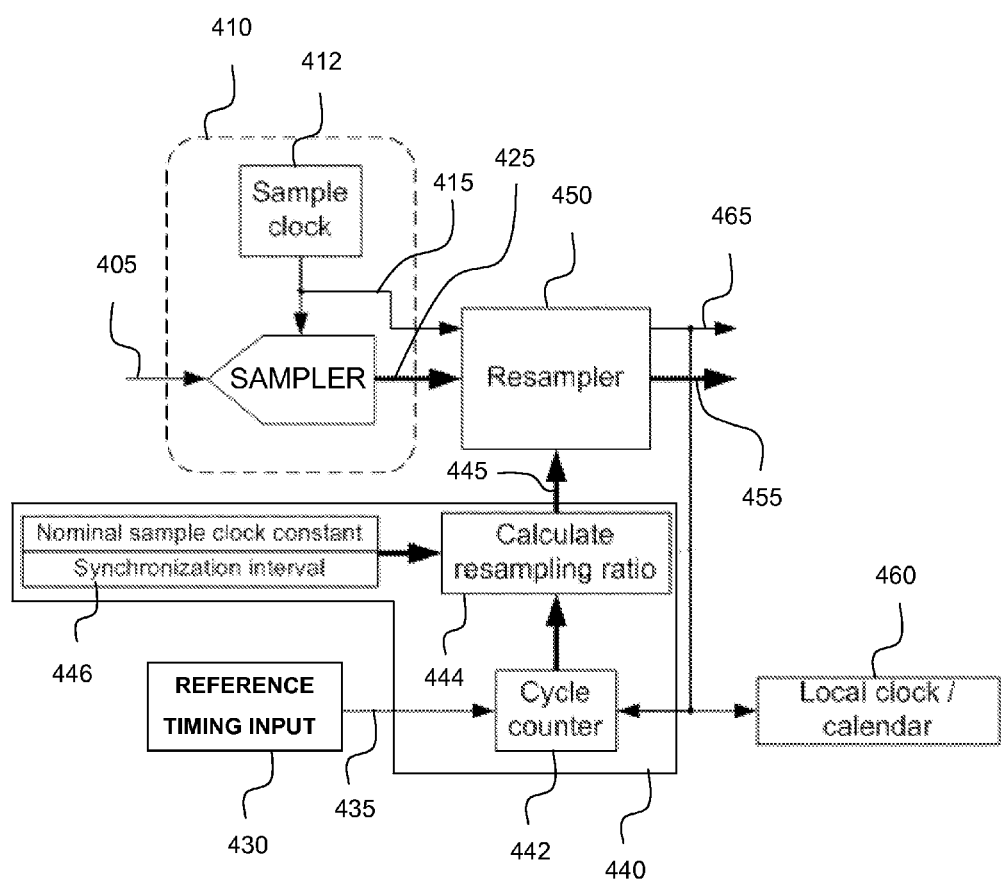
FIG. 4 illustrates portions of one embodiment of a device for synchronizing data to a reference timing signal that provides a common sense of time.

Accordingly, FIG. 4 illustrates one embodiment of a device 400 for synchronizing data to a reference timing signal that provides a common sense of time.

Device 400 includes a signal processor 410, a reference timing input 430, a resampler controller 440, a resampler 450, and a local clock/calendar 460. Signal processor 410 includes a sample clock 412 and a sampler 414. In some embodiments sample clock 412 comprises a crystal oscillator. In some embodiments sampler 414 comprises an ADC. In some embodiments, reference timing input 430 may comprise a GPS receiver that receives a GPS signal and provides a GPS PPS signal that may be synchronized to UTC. In other embodiments, reference timing input 430 may comprise an IEEE-1588 interface that provides a reference timing signal that may be synchronized to UTC. Other arrangements are possible. Controller 440 includes a cycle counter 442 and a resampling ratio calculator 444, and employs parameters 446 as will be discussed in greater detail below.

In operation, sample clock 412 outputs a sample clock signal 415. Sampler 414 samples a data signal 405 in accordance with sample clock signal 415, and outputs a sampled data signal 425. Meanwhile, reference timing input 430 provides to controller 440 a reference timing signal 435 generated from a first clock that is external to device 400, for example a clock associated with a GPS transmitter, or a system clock included in another device connected over a network to device 400. Of significance, in device 400 sample clock 412 operates independently from the first clock from which reference timing signal 435 is generated, and sample clock signal 415 is asynchronous with reference timing signal 435. More specifically, sample clock signal 415 is not phase locked or otherwise synchronized to reference timing signal 435, and the two signals are allowed to free run asynchronously with respect to each other.

Resampler 450 receives sample clock signal 415 and sampled data signal 425, resamples the sampled data signal 425 according to a resampling ratio 445 supplied by controller 440 and outputs a resampled data signal 455 such that the number of data samples in the resampled data signal 455 within a synchronization time interval defined with respect to the reference timing signal 435 equals the ideal or nominal number of data samples that would occur in the sampled data signal 425 within the synchronization time interval if the sample clock signal 415 was synchronized to reference timing signal 435. Controller 440 employs parameters 446, including a nominal sample clock constant parameter and a synchronization time interval parameter, to provide resampling ratio 445 to resampler 450.

In particular, when there is no drift between the sample clock signal 415 and reference timing signal 435, then resampling ratio 445 is 1. On the other hand, when sample clock 412 is operating at a slower rate with respect to reference timing signal 435, then resampling ratio 445 will be greater than 1 so as to cause the number of resampled data samples in resampled data signal 455 within each synchronization time interval to be greater than the number of sampled data samples in sampled data signal 425 within each synchronization time interval, and to match the ideal or nominal number of data samples that would occur in the sampled data signal 425 within the synchronization time interval if the sample clock signal 415 was synchronized to reference timing signal 435. Conversely, when sample clock 412 is operating at a faster rate with respect to reference timing signal 435, then resampling ratio 445 will be less than 1 so as to cause the number of resampled data samples in resampled data signal 455 within each synchronization time interval to be less than the number of sampled data samples in sampled data signal 425 within each synchronization time interval, and to match the ideal or nominal number of data samples that would occur in the sampled data signal 425 within the synchronization time interval if the sample clock signal 415 was synchronized to reference timing signal 435.

In greater detail, resampler 450 outputs a resampled sample clock signal 465 to cycle counter 442 of controller 440, which counts cycles of the resampled sample clock signal 465 using reference timing signal 435. From the output of cycle counter 442, resampling ratio calculator 444 determines the number of cycles of resampled sample clock signal 465 that occur within each synchronization time interval as measured with respect to reference timing signal 435. Meanwhile, the nominal sample clock constant parameter indicates the nominal number of resampled sample clock periods that would occur within the synchronization time interval if sample clock signal 415 was synchronized to reference timing signal 435. Resampling ratio calculator 444 employs the nominal sample clock constant parameter and the output of cycle counter 442 to calculate a new resampling ratio 445 for each synchronization interval so as to cause the number of resampled data samples in resampled data signal 455 within each synchronization time interval to match the ideal or nominal number of data samples that would occur in the sampled data signal 425 within the synchronization time interval if the sample clock signal 415 was synchronized to reference timing signal 435.

An example will illustrate the operation of resampler 450 and controller 440. Consider an example embodiment of device 400 where sample clock 412 operates and outputs sample clock signal 415 at a nominal frequency of 10 MHz. Furthermore, in this example it is assumed that the synchronization time interval is 1000 seconds. In that case, the nominal sample clock constant (N) is 10^10, indicating that nominally or ideally 10^10 sample clock cycles should occur within each 1000-second synchronization interval, as measured with respect to the reference timing signal. Further, in this example it is assumed that the sample clock 412 is operating two clock cycles per second slower that reference timing signal 435. In that case, there is a deviation (D) of −2000 sample clock cycles from the nominal number of sample clock cycles in each synchronization interval. In that case, resampling ratio calculator 444 of controller 440 calculates the resampling ratio 445 (R) as:

$$R=(N-D)/N=(10\wedge 10+2000)/10\wedge 10=1.0000002 \quad (1)$$

In this example, controller 440 updates the resampling ratio 445 every 1000 seconds, corresponding to the resynchronization time interval.

In general, when resampling ratio 445 is updated an abrupt change is caused in resampled data signal 455. To address this abrupt changes, in some embodiments resampler 450 applies a small time shift to a plurality of data samples over the synchronization time interval to more evenly spread the change to the resampled data signal 455 throughout the synchronization time interval. Using the illustrative example above, time shifting ten million data samples by −20 picoseconds each over the synchronization time interval of 1000 seconds will achieve a desired change in the resampling rate from 1 to 1.0000002. To provide the smoothest transition in resampling rate, the step sizes should be as small as possible. The minimum step size, and hence the maximum number of steps per second, is determined by the maximum update rate that resampler 450 can accept. Accordingly, the sampled data is more consistent over time and local clock/calendar 460 will drift less over time.

In some embodiments, resampler 450 may comprise a decimator and fractional interpolator. In some embodiments, resampler 450 may further comprise a fractional delay filter for applying the aforementioned time shifts to the data samples. Examples of resamplers may be found in U.S. Pat. Nos. 5,235,534 and 5,513,209.

As the data samples in resampled data signal 455 are synchronized to reference timing signal 435 via controller 440 and resampler 450, when time stamps (e.g., UTC time stamps) generated from reference timing signal 435 are periodically inserted in resampled data signal 455 at fixed time intervals, it can be assured that a substantially uniform or constant number of data samples are present between adjacent time stamps. For example, in some embodiments the fixed time interval between time stamps can be the same as the synchronization time interval (e.g., 1000 seconds).

Figure 5:
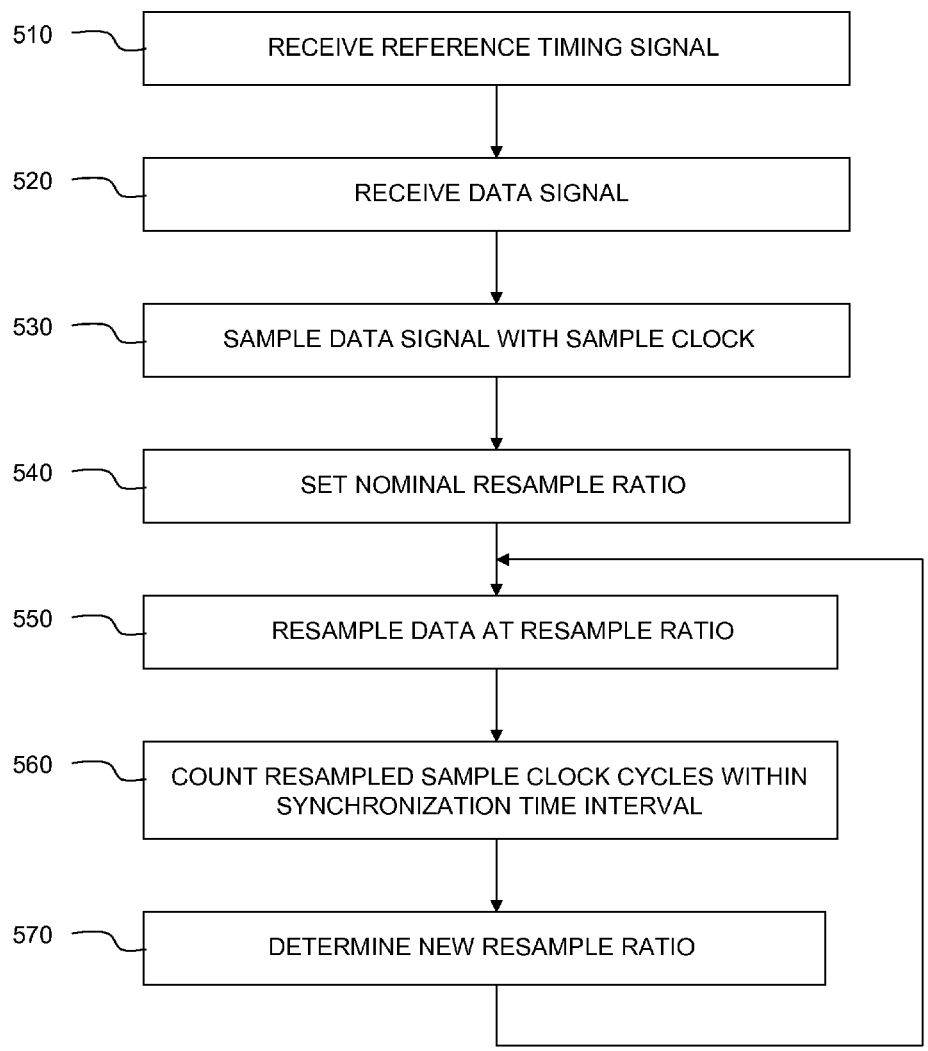
FIG. 5 illustrates one embodiment of a method for synchronizing data to a reference timing signal that provides a common sense of time.

FIG. 5 illustrates one embodiment of a method for synchronizing data to a reference timing signal that provides a common sense of time.

In a step 510, a device receives a reference timing signal generated from a first clock that is external to the device, for example a GPS timing signal received via a GPS receiver.

In a step 520, the device receives a data signal.

In a step 530, the device samples the data signal with a sample clock signal output by a sample clock, and produces a sampled data signal. The sample clock operates independently from the first clock from which the reference timing signal is generated, and the sample clock signal is asynchronous with the reference timing signal.

In a step 540, a nominal resample ratio is established, for example a resampling ratio of 1.

In a step 550, a resampler in the device resamples the sampled data signal using the resampling ratio.

In a step 560, a controller in the device counts a number of resampled sample clock periods within a synchronization time interval. The synchronization interval is a time period for updating the resampling rate that is defined with respect to the reference timing signal.

In a step 570, the controller compares the counted number of resampled sample clock periods with a nominal number of resampled sample clock periods that would occur within the synchronization time interval if the sample clock signal was synchronized to the reference timing signal, and updates the resampling ratio in response to the comparison. As a result, the resampled data is now synchronized to the reference timing signal, even though the sample clock in the device remains unsynchronized to the reference timing signal.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A device, comprising:
an input configured to provide a reference timing signal generated from a first clock;
a sample clock that operates independently from the first clock, wherein the sample clock outputs a sample clock signal that is asynchronous with the reference timing signal;
a sampler configured to sample a data signal in accordance with the sample clock signal and outputting a sampled data signal;
a resampler configured to resample the sampled data signal according to a resampling ratio and outputting a resampled data signal such that a number of data samples in the resampled data signal within a synchronization time interval defined with respect to the reference timing signal equals a nominal number of data samples that would occur in the sampled data signal within the synchronization time interval when the sample clock signal was synchronized to the reference timing signal; and
a time stamper configured to periodically insert time stamps within the resampled data signal at fixed time intervals as measured with respect to the reference timing signal.

2. The device of claim 1, wherein the reference timing signal is a coordinated universal time (UTC) signal.

3. The device of claim 1, wherein the reference timing signal is Global Positioning System (GPS) timing signal.

4. The device of claim 1, wherein the input receives the reference timing signal via an IEEE-1588 interface.

5. The device of claim 1, wherein the sampler comprises an analog-to-digital converter (ADC).

6. The device of claim 1, wherein the resampler applies a time shift to a plurality of data samples spread over the synchronization time interval to achieve a change in the resampling rate.

7. The device of claim 1, wherein the resampler further resamples the sample clock signal and outputs a resampled sample clock signal.

8. The device of claim 7, further comprising a controller configured to receive the reference timing signal and the resampled sample clock signal and in response thereto to generate the resampling ratio for each synchronization time interval and to provide the resampling ratio to the resampler.

9. The device of claim 1, the fixed time interval is the synchronization time interval.

10. A method, comprising:
providing a reference timing signal;
generating a sample clock signal independent of, and asynchronous with, the reference timing signal;
receiving a data signal;
sampling the data signal in response to the sample clock signal to produce a sampled data signal;
setting a resampling ratio; and
resampling the sampled data signal according to the resampling ratio,
wherein the resampling ratio is updated once for each synchronization time interval such that a number of data samples in the resampled data signal within each synchronization time interval equals a nominal number of data samples that would occur in the sampled data signal within each synchronization time interval when the sample clock signal was synchronized to the reference timing signal, wherein the synchronization time interval is defined with respect to the reference timing signal.

11. The method of claim 10, wherein the reference timing signal is a coordinated universal time (UTC) signal.

12. The method of claim 10, wherein the reference timing signal is Global Positioning System (GPS) timing signal.

13. The method of claim 10, wherein the reference timing signal is produced from an IEEE-1588 interface.

14. The method of claim 10, wherein sampling the data signal comprises performing an analog-to-digital conversion of the data signal.

15. The method of claim 10, wherein resampling includes applying a time shift to a plurality of data samples spread over the synchronization time interval to achieve a change in the resampling rate.

16. A method, comprising:
providing a reference timing signal according to a first clock;
outputting a sample clock signal that is asynchronous with the reference timing signal according to a sample clock that operates independently from the first clock;
sampling a data signal according to the sample clock signal and outputting a sampled data signal;
resampling the sampled data signal according to a resampling ratio;
outputting a resampled data signal such that a number of data samples within a synchronization time interval defined with respect to the reference timing signal equals a nominal number of data samples having an equivalent number of sample that would occur in the sampled data signal within the synchronization time interval when the sample clock signal was synchronized to the reference timing signal; and
periodically inserting time stamps within the resampled data signal at a fixed time interval as measured with respect to the reference timing signal.

17. The method of claim 16, further comprising:
counting a number of resampled sample clock periods within the synchronization time interval;
comparing the counted number of resampled sample clock periods with a nominal number of resampled sample clock periods that would occur within the synchronization time interval when the sample clock signal was synchronized to the reference timing signal; and
updating the resampling ratio in response to the comparison.

18. The method of claim 16, wherein the fixed time interval is the synchronization time interval.

19. A device, comprising:
an input configured to provide a reference timing signal generated from a first clock;
a sample clock that operates independently from the first clock, wherein the sample clock outputs a sample clock signal that is asynchronous with the reference timing signal;
a sampler configured to sample a data signal in accordance with the sample clock signal and outputting a sampled data signal; and
a resampler configured to resample the sampled data signal according to a resampling ratio and outputting a resampled data signal, wherein the resampling ratio is updated once for each synchronization time interval such that a number of data samples in the resampled data signal within a synchronization time interval defined with respect to the reference timing signal equals a nominal number of data samples that would occur in the sampled data signal within the synchronization time interval when the sample clock signal was synchronized to the reference timing signal.

* * * * *

UNITED STATES PATENT AND TRADEMARK OFFICE
CERTIFICATE OF CORRECTION

PATENT NO. : 8,767,898 B2  Page 1 of 1
APPLICATION NO. : 12/910263
DATED : July 1, 2014
INVENTOR(S) : Gery Verhaegen et al.

It is certified that error appears in the above-identified patent and that said Letters Patent is hereby corrected as shown below:

In the Claims

In column 9, line 9, in claim 9, delete "the fixed" and insert -- wherein the fixed --, therefor.

Signed and Sealed this
Fourteenth Day of October, 2014

Michelle K. Lee
*Deputy Director of the United States Patent and Trademark Office*